US008015697B2

(12) United States Patent
Park et al.

(10) Patent No.: US 8,015,697 B2
(45) Date of Patent: Sep. 13, 2011

(54) CHIP MOUNTER FOR RECOGNIZING BGA PACKAGE THROUGH CHIP MOUNTER

(75) Inventors: Yun-Won Park, Seongnam-si (KR); Hyung-Gun Park, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 0 days.

(21) Appl. No.: 12/480,904

(22) Filed: Jun. 9, 2009

(65) Prior Publication Data

US 2010/0000084 A1 Jan. 7, 2010

(30) Foreign Application Priority Data

Jul. 7, 2008 (KR) ........................ 10-2008-0065544

(51) Int. Cl.
*H01R 43/00* (2006.01)

(52) U.S. Cl. ................ 29/740; 29/741; 29/739; 29/720; 29/833; 414/411

(58) Field of Classification Search .................... 29/729, 29/739, 740–742, 705–719, 721–722; 226/76; 414/411; 382/148–151, 289–291, 319
See application file for complete search history.

(56) References Cited

U.S. PATENT DOCUMENTS 5,400,904 A 3/1995 Maston, III et al.
6,374,484 B1 * 4/2002 Yoshida et al. ................ 29/740
6,902,090 B2 * 6/2005 Yamamura et al. ............. 226/32
7,017,263 B2 * 3/2006 Yanagida ........................ 29/833
7,446,423 B2 * 11/2008 Sakai et al. ................... 257/783
2003/0006491 A1 1/2003 Davenport et al.
2007/0052112 A1 3/2007 Bauer et al.

FOREIGN PATENT DOCUMENTS

JP 2004-047758 A 2/2004
KR 10-0278571 B1 10/2000
KR 10-0661844 B1 12/2006

* cited by examiner

*Primary Examiner* — Minh Trinh

(74) *Attorney, Agent, or Firm* — Drinker Biddle & Reath LLP

(57) ABSTRACT

Provided is a chip mounter for recognizing a Ball Grid Array (BGA) package through a chip mounter. The chip mounter includes a BGA package recognition apparatus which includes an image acquisition unit which acquires image information of a BGA package which includes a plurality of solder balls having n patterns ($n \geqq 1$), a pattern recognition unit which analyzes the image information and outputs information about the BGA package, and a storage unit which stores the information about the BGA package, wherein the pattern recognition unit recognizes the n patterns, selects n seeds respectively corresponding to the n patterns and performs a seed growing operation which groups solder balls which are continuously located adjacent to the seed and have the same pattern as the seed into the same group as the seed, with respect to each of the n seeds.

14 Claims, 10 Drawing Sheets

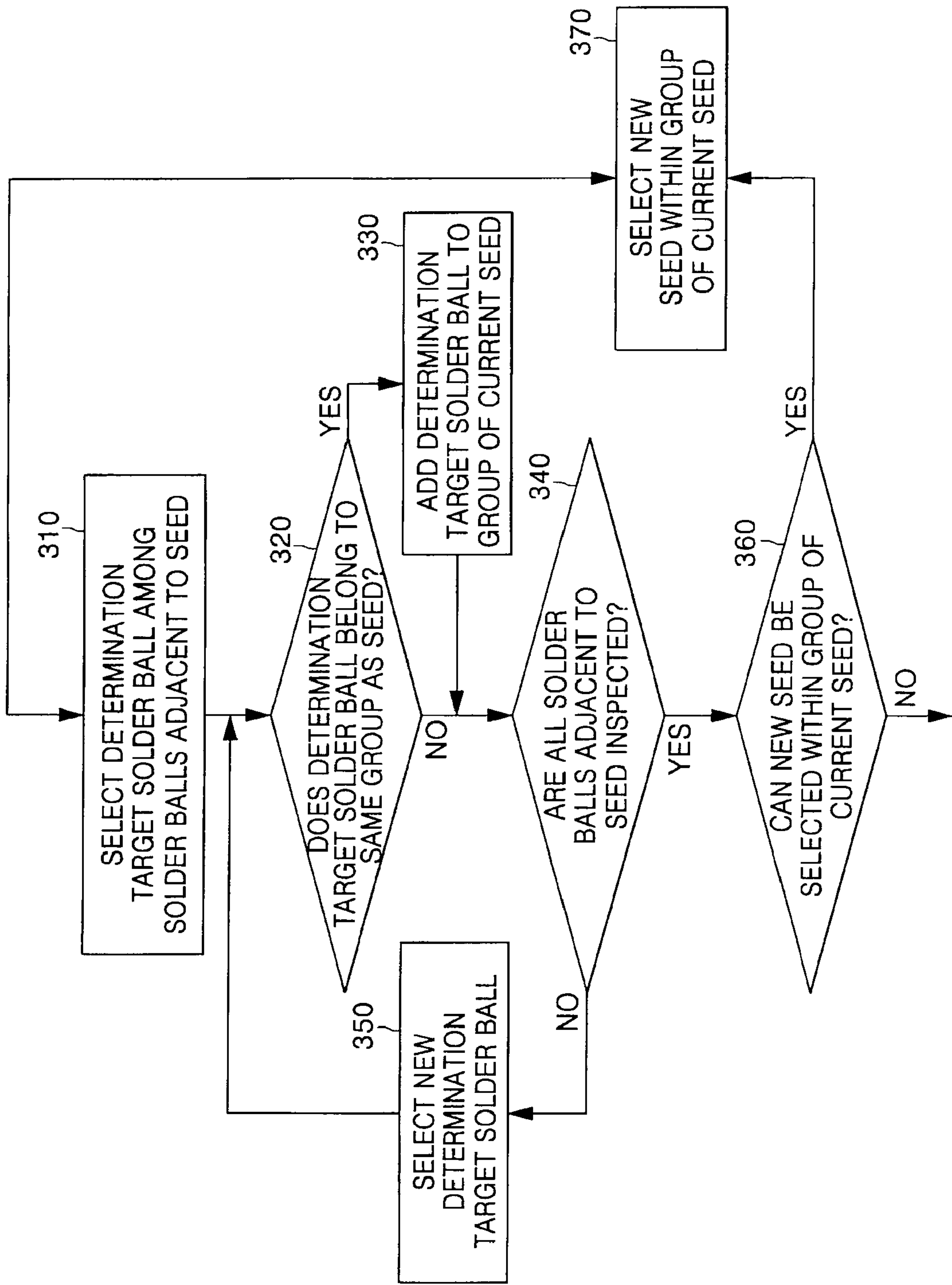
FIG. 4
310
SELECT DETERMINATION TARGET SOLDER BALL AMONG SOLDER BALLS ADJACENT TO SEED
320
DOES DETERMINATION TARGET SOLDER BALL BELONG TO SAME GROUP AS SEED?
YES
NO
330
ADD DETERMINATION TARGET SOLDER BALL TO GROUP OF CURRENT SEED
340
ARE ALL SOLDER BALLS ADJACENT TO SEED INSPECTED?
YES
NO
350
SELECT NEW DETERMINATION TARGET SOLDER BALL
360
CAN NEW SEED BE SELECTED WITHIN GROUP OF CURRENT SEED?
YES
NO
370
SELECT NEW SEED WITHIN GROUP OF CURRENT SEED

⇩

⇩

⇩

⇩

⇩

⇩

CHIP MOUNTER FOR RECOGNIZING BGA PACKAGE THROUGH CHIP MOUNTER

CROSS-REFERENCE TO RELATED APPLICATION

This application claims priority to and the benefit of Korean Patent Application No. 2008-0065544, filed on Jul. 7, 2008, the disclosure of which is incorporated herein by reference in its entirety.

BACKGROUND

The present invention relates to a chip mounter and a method for recognizing a Ball Grid Array (BGA) package in a chip mounter. Various embodiments of the invention relate to an apparatus and method for automatically recognizing and registering information about a BGA package in which solder balls have a plurality of patterns through a chip mounter.

A chip mounter is an apparatus for mounting electronic parts supplied through a part supply apparatus on a printed circuit board (PCB) substrate. Thousands of kinds of electronic parts including an electronic part which includes a BGA package are mounted on a PCB substrate by a chip mounter.

FIG. 1A is a plan view of a typical chip mounter. A chip mounter 1 includes a bed 2, a part supply unit 3 which is mounted on the bed 2 to supply an electronic part 7, a substrate transfer unit 4 which transfers a PCB substrate 5 externally supplied to a part mounting area A, a head 6 which picks up the electronic part 7 supplied by the part supply unit 3 and mounts it on the PCB substrate 5, and a central control unit (not shown) which controls overall operation of the chip mounter 1.

Operation of the chip mounter will be described below with reference to FIG. 1A.

The electronic part 7 supplied by the part supply unit 3 is adhered to and lifted up to a predetermined height using the head 6. Then, the electronic part 7 is transferred to a predetermined location by a transfer unit (not shown). At this time, the electronic part is inspected for defects using, for example, a camera installed in the head 6. The chip mounter 1 mounts the corresponding electronic part 7 at a predetermined location of the PCB substrate 6 if it is determined as not being defective and discards the corresponding electronic part if it is determined as defective.

When inspecting whether an electronic part is defective or not, a method for comparing information of an electronic part which is previously stored and image information of a part obtained using a camera is commonly used in a chip mounter. Therefore, a process for storing information of a corresponding part in advance is required. An auto teaching technique is one of techniques used to this end. That is, a chip mounter includes a part recognition unit which automatically recognizes and stores information of an electronic part supplied from a part supply unit. In order to inspect whether an electronic part is defective or not, a chip mounter compares information of an electronic part which is previously stored and image information of a part acquired by, for example, a camera, and determines an electronic part as normal if the information is identical and as defective if it is not identical.

However, when an electronic part includes a BGA package, particularly when there are two or more patterns of solder balls, there is no technique which automatically recognizes and stores information of an electronic part. Thus, for an electronic part with two or more patterns of solder balls, information of a part is stored such that an expert manually inputs information about some of the solder balls such as a pattern of a solder ball. However, in this case, it takes a long time to store information about a part, and even when an electronic part is inspected for defects by using information of a part manually stored, many errors occur. For example, a normal part can be determined as defective.

SUMMARY

Various embodiments of the present invention are directed to a BGA packet recognition apparatus which automatically recognizes and stores information of an electronic part which includes a BGA package, particularly, in which solder balls have a plurality of patterns.

They are also directed to a BGA package recognition method for achieving the above object.

According to an aspect of the present invention, there is provided a chip mounter, comprising: a Ball Grid Array (BGA) package recognition apparatus including: an image acquisition unit which acquires image information of a BGA package which includes a plurality of solder balls having n patterns wherein n is an integer which is equal to or more than 1; a pattern recognition unit which analyzes the image information and outputs information about the BGA package; and a storage unit which stores the information about the BGA package, wherein the pattern recognition unit recognizes the n patterns, selects n seeds respectively corresponding to the n patterns and performs a seed growing operation which groups solder balls which are continuously disposed adjacent to the seed and have the same pattern as the seed into the same group as the seed, with respect to each of the n seeds.

The information of the BGA package may include information as to how many groups the plurality of solder balls are grouped into, the number of solder balls which belong to each group, and a vertical distance and a horizontal distance between solder balls which belong to each group.

The pattern recognition unit may sequentially or simultaneously perform the seed growing operation with respect to each of the n seeds.

The pattern recognition unit may select a plurality of seeds within a group corresponding to each of the n seeds and simultaneously perform the seed growing operation with respect to each of the plurality of seeds.

The pattern recognition unit may perform the seed growing operation until there is no solder ball which is not grouped or there remain only solder balls which are not recognized as a group among the plurality of solder balls.

The pattern recognition unit may select, as a seed, four solder balls which are configured in a rectangular form among the plurality of solder balls or two solder balls which are horizontally or vertically configured if there are no solder balls configured in a rectangular form.

The pattern recognition unit may select the seed in an area in which solder balls are most densely disposed.

The pattern recognition unit may perform the seed growing operation by selecting a determination target solder ball among solder balls adjacent to the seed, performing a grouping operation for adding the determination target solder ball to the same group as the seed if the determination target solder ball has the same pattern as the seed and performing the grouping operation based on a new seed if a new seed can be selected within the same group as the seed.

The pattern recognition unit may determine that the determination target solder ball is in the same pattern as the seed if a distance between the seed and the determination target solder ball is equal to a vertical distance between solder balls which configure the seed when a solder ball above or below the seed is selected as the determination target solder ball, and determine that the determination target solder ball is in the same pattern as the seed if a distance between the seed and the determination target solder ball is equal to a horizontal distance between solder balls which configure the seed when a solder ball at the left or right side of the seed is selected as the determination target solder ball.

The pattern recognition unit may additionally acquire information about the size of the plurality of solder balls, select the seed among solder balls which are the same in size and perform the seed growing operation with respect to solder balls which configure the seed and solder balls which are the same in size.

The pattern recognition unit may select the determination target solder ball among solder balls which are adjacent to the seed and are the same in size as solder balls which configure the seed.

The pattern recognition unit may perform the grouping operation by additionally determining whether or not the size of the determination target solder ball is identical to the size of solder balls which configure the seed.

The chip mounter may further include a part supply unit which supplies the BGA package; a substrate transfer unit which transfers a printed circuit board (PCB) substrate which is externally supplied; a head which includes the image acquisition unit and mounts a BGA package supplied from the part supply unit on the PCB substrate; and a controller which includes the pattern recognition unit and the storage unit and controls the part supply unit, the substrate transfer unit, and the head.

According to another aspect of the present invention, there is provided a method for recognizing a Ball Grid Array (BGA) package, comprising: selecting a seed among a plurality of solder balls of a BGA package; and growing the seed by grouping solder balls which are continuously disposed adjacent to the seed and have the same pattern as the seed into the same group as the seed.

If a new seed can be selected among solder balls which are not grouped, a new seed may be selected, and the growing the seed may be repetitively performed.

The growing the seed may be repetitively performed until there is no solder ball which is not grouped or there remain only solder balls which are not recognized as a group among the plurality of solder balls.

A plurality of seeds may be selected in the selecting the seed among a plurality of solder balls, and the growing the seed may be performed with respect to each of the plurality of seeds.

The selecting the seed among a plurality of solder balls may include selecting, as a seed, four solder balls which are configured in a rectangular form among the plurality of solder balls or two solder balls which are horizontally or vertically configured if there are no solder balls configured in a rectangular form.

The selecting the seed among a plurality of solder balls may include selecting the seed in an area in which solder balls are most densely disposed.

The growing the seed may include grouping solder balls which are adjacent to the seed and have the same pattern as the seed into the same group as the seed; and repeating the grouping solder balls based on a new seed if a new seed can be selected within the same group as the seed.

The grouping of the solder balls may include selecting a determination target solder ball among solder balls adjacent to the seed; adding the determination target solder ball to the same group as the seed if the determination target solder is in the same pattern as the seed; and selecting a new determination target solder ball to repeat the adding the determination target solder ball until all solder balls adjacent to the seed are determined.

The adding of the determination target solder ball may include adding the determination target solder ball to the same group as the seed if a distance between the seed and the determination target solder ball is equal to a vertical distance between solder balls which configure the seed when a solder ball above or below the seed is selected as the determination target solder ball, and adding the determination target solder ball to the same group as the seed if a distance between the seed and the determination target solder ball is equal to a horizontal distance between solder balls which configure the seed when a solder ball at the left or right side of the seed is selected as the determination target solder ball.

The selecting of the seed among a plurality of solder balls may include selecting the seed among solder balls which are the same in size; and selecting the determination target solder ball among solder balls which are adjacent to the seed and are the same in size as solder balls which configure the seed.

The selecting of the seed among a plurality of solder balls may include selecting the seed among solder balls which are the same in size, and the adding the determination target solder ball may include adding the determination target solder ball to the same group as the seed if the determination target solder ball is identical in size to the size of solder balls which configure the seed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 4 is a flowchart illustrating a seed growth step in a method for recognizing a BGA package through a chip mounter according to an exemplary embodiment of the present invention;

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1A:
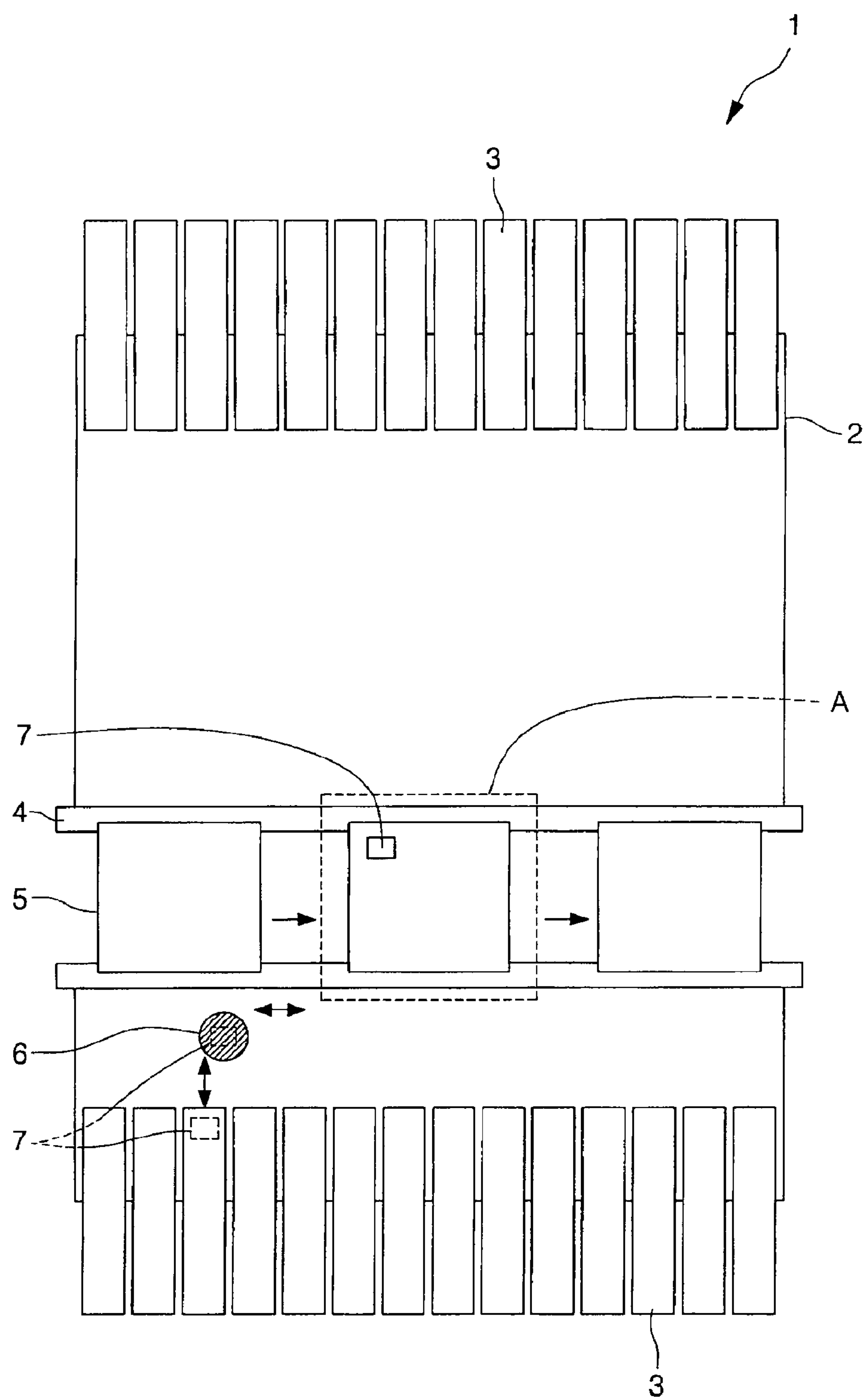
FIG. 1A is a plan view of a typical chip mounter.
Figure 1B:
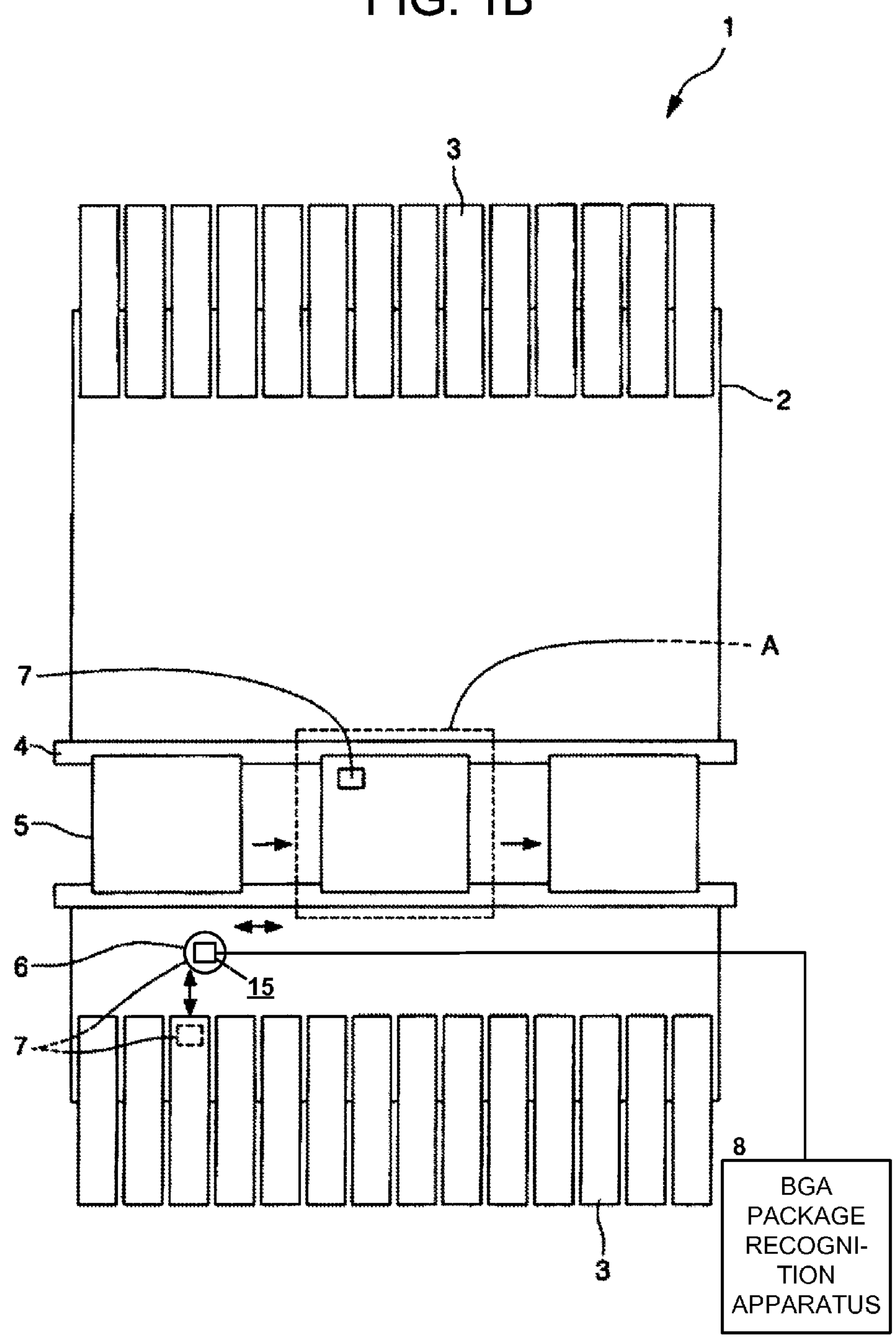
FIG. 1B is a plan view of a chip mounter according to an embodiment of the invention.

FIG. 1B is a plane view of a chip mounter according to an embodiment of the invention. This Figure has numerous elements in common with FIG. 1A, and a description thereof will not be repeated. In FIG. 1B, a BGA pattern recognition apparatus 8 has been added to the system, along with an associated camera 15.

Figure 2:
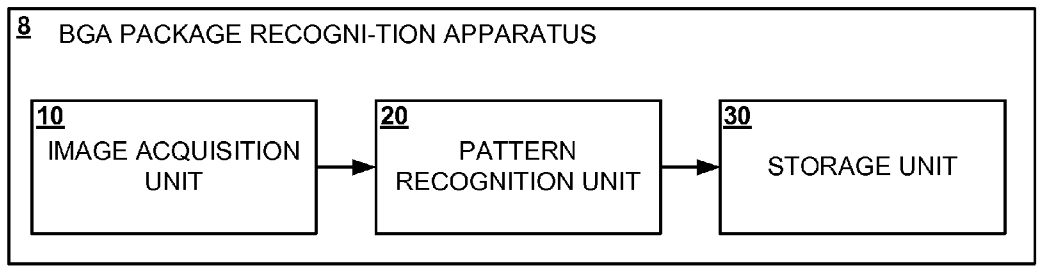
FIG. 2 is a block diagram of a BGA package recognition apparatus of a chip mounter according to an exemplary embodiment of the present invention.

FIG. 2 is a block diagram of a BGA package recognition apparatus 8 of a chip mounter 1 according to an exemplary embodiment of the present invention.

The BGA package recognition apparatus 8 includes an image acquisition unit 10, a pattern recognition unit 20, and a storage unit 30.

Functions of the respective blocks shown in FIG. 2 will be described below.

The image acquisition unit 10 acquires image information of an electronic part which includes a BGA package supplied from a part supply unit and outputs the image information to the pattern recognition unit 20. The image acquisition unit 10 may include, for example, a camera 15 installed in a head of a chip mounter.

The pattern recognition unit 20 acquires location information of solder balls on a BGA package from the image information, extracts information of an electronic part which includes a BGA package using the location information and outputs the information of the electronic part to the storage unit 30. The information may include information as to how many groups the solder balls on the BGA package are grouped into, a horizontal distance, and a vertical distance between the solder balls which belong to each group, and information as to how many balls belong to each group. A method for extracting the information through the pattern recognition unit 20 will be described below in detail.

The storage unit 30 stores information of an electronic part output from the pattern recognition unit 20.

The pattern recognition unit 20 and the storage unit 30 can be configured to be included in a controller of a chip mounter.

Figure 3:
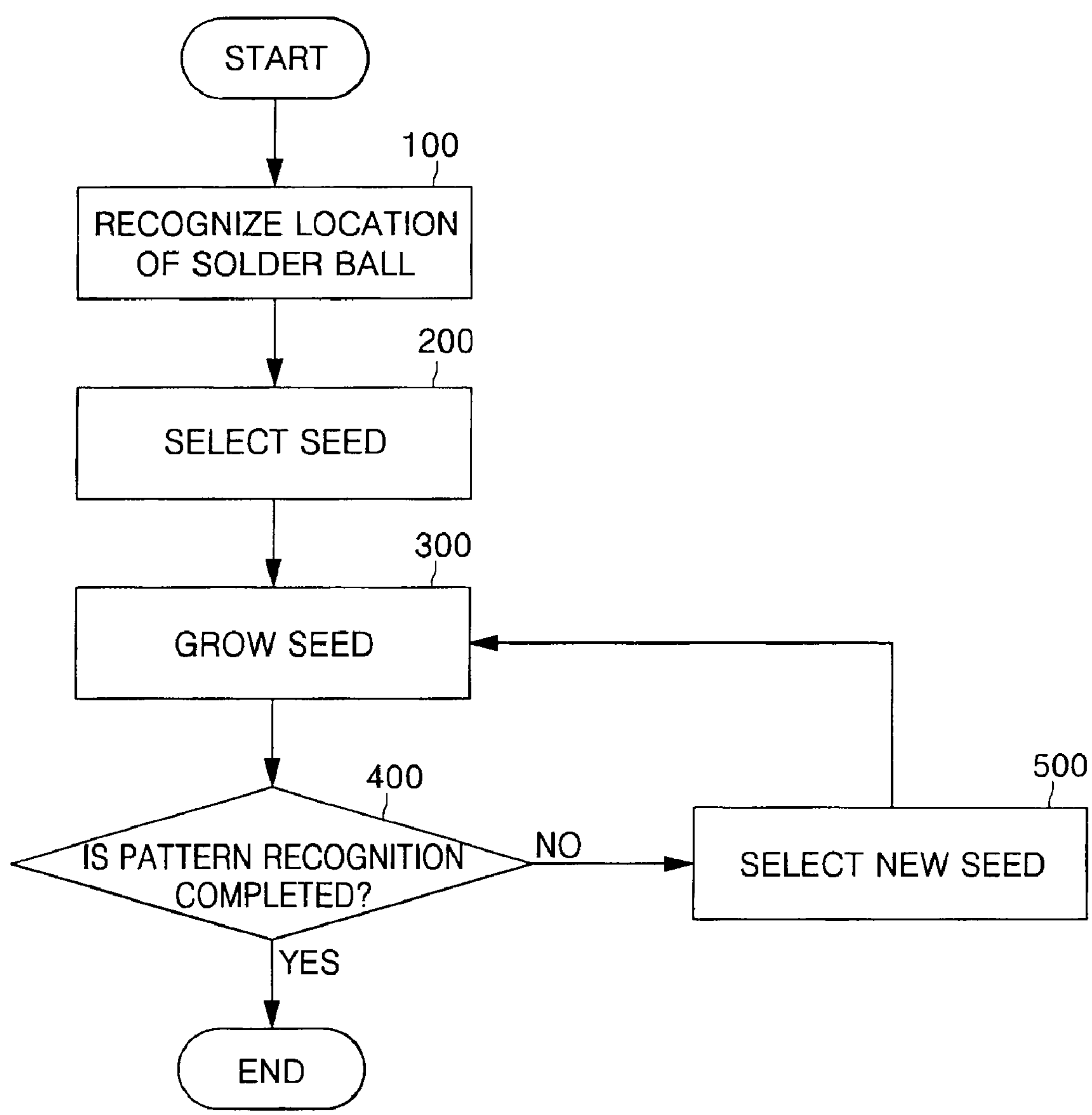
FIG. 3 is a flowchart illustrating a method for recognizing a BGA package through a chip mounter according to an exemplary embodiment of the present invention.

FIG. 3 is a flowchart illustrating a method for recognizing a BGA package according to an exemplary embodiment of the present invention. A method for recognizing a BGA package according to an exemplary embodiment of the present invention will be described below with reference to FIG. 3.

First, image information of a BGA package is acquired through the image acquisition unit which includes, for example, a camera, and location information of solder balls of the BGA package is acquired using image information (step S100). Information about the size of the solder balls can be additionally acquired if necessary.

Next, a seed is selected among the solder balls (step S200). Four solder balls which are configured in a rectangular form are preferably selected as the seed. If there are no solder balls which are configured in a rectangular form, two solder balls which are vertically or horizontally configured are selected as the seed. If information about the size of the solder balls is additionally acquired in step S100, the seed can be selected among solder balls which are same in size. The seed can be selected in an area in which the solder balls are most dense in image information of a BGA package or can be selected in a certain area. Also, a plurality of seeds may be simultaneously selected. If a plurality of seeds are selected, the seeds may have the same pattern or different patterns.

Next, the solder balls are grouped by determining whether solder balls in an area surrounding the seed belong to the same group as the seed or not, and the seed is grown by a method for storing group information of solder balls (step S300). That is, among the solder balls in the area surrounding the seed, solder balls which have the same characteristic as the solder balls which configure the seed are determined as the same group as the seed and are grouped into the same group as the seed, and group information is stored. For example, among the solder balls in the area surrounding the seed, solder balls which have the same pattern as the solder balls which configure the seed (for example, solder balls in which a horizontal distance and/or a vertical distance therebetween is equal to a horizontal distance and/or a vertical distance between adjacent solder balls which configure the seed) can be determined as belonging to the same group as the seed.

If information about the size of the solder balls is additionally acquired in step S100, information about the size of the solder balls may be used in determining whether the solder balls in the area surrounding the seed belong to the same group as the seed or not. For example, solder balls which are identical in size as well as a horizontal and/or vertical pitch to the solder balls which configure the seed may be determined as belonging to the same group as the seed, or only solder balls which are identical in size to the solder balls which configure the seed may be determined to belong to the same group as the seed or not. If a plurality of seeds are selected in step S200, the above-described process may be simultaneously performed for all seeds.

Next, it is determined whether pattern recognition is completed or not (step S400). For example, pattern recognition may be determined to be completed if the number of solder balls which are not grouped is zero or there remain only solder balls which cannot be grouped.

If it is determined in step S400 that pattern recognition is completed, recognition of the BGA package is finished. However, if is determined in step S400 that pattern recognition is not completed, a new seed is selected among solder balls which are not grouped, and step S300 is repeated (step S500). The new seed may have a different pattern from the seed selected in step S200 or may have the same pattern as the seed selected in step S200 but exist separate from the same group as the seed selected in step S200.

FIG. 4 is a flowchart illustrating an embodiment of step S300 in a method for recognizing a BGA package according to the present invention shown in FIG. 3. A method for growing a seed in a method for recognizing a BGA package according to various embodiments of the present invention will be described below with reference to FIG. 4.

First, a determination target solder ball is selected among solder balls adjacent to a seed (step S310). For example, among the solder balls adjacent to the seed, solder balls above the seed may be first selected as the determination target solder ball.

Next, it is determined whether the determination target solder ball belongs to the same group as the seed or not (step S320). For example, if a solder ball above (or below) a seed is selected as a determination target solder ball, it may be determined that the determination target solder ball belongs to the same group as the seed when a vertical distance between the seed and the determination target solder ball is equal to a vertical distance between solder balls which configure the seed. If a solder ball on a right (or left) side of a seed is selected as the determination target solder ball, it may be determined that the determination target solder ball belongs to the same group as the seed when a horizontal distance between the seed and the determination target solder ball is equal to a horizontal distance between the solder balls which configure the seed.

When additionally information about the size of the solder balls is acquired in step S100 and the seed is selected among solder balls which are the same in size in step S200, a solder ball which is identical in size to the solder balls which configure the seed among solder balls adjacent to the seed may be selected as the determination target solder ball in step S310, and it may be determined that the determination target solder ball belongs to the same group as the seed if it is identical in vertical distance or horizontal distance and size.

Next, if it is determined in step S320 that the determination target solder ball belongs to the same group as the seed, the determination target solder ball is added to the group of the current seed (step S330).

Next, it is determined whether all of the solder balls adjacent to the seed have been inspected or not (step S340).

If it is determined in step S340 that all of the solder balls adjacent to the seed have not been inspected, a new determination target solder ball is selected among the uninspected solder balls adjacent to the seed, and steps 320 to 340 are repeated (step S350).

If it is determined in step S340 that all of the solder balls adjacent to the seed have been inspected, it is determined whether a new seed can be selected within the group of the current seed or not (step S360).

If it is determined in step S360 that a new seed can be selected, a new seed is selected within the group of the current seed, and then steps 310 to 360 are repeated (step S370).

If it is determined in step S360 that a new seed cannot be selected, growing of the seed is finished, and step S400 is performed.

Using the method for recognizing a BGA package according to an embodiment of the present invention shown in FIGS. 3 and 4, solder balls which configure a multi-BGA package can be grouped into a plurality of groups. Therefore, the number of groups which configure a multi-BGA package can be determined by counting the number of groups (for example, the number of groups is increased by one whenever a new seed is selected in step S500). Also, the number of solder balls which belong to each group can be determined by counting the number of solder balls which belong to each group (for example, the number of solder balls is increased by one whenever a determination target solder ball is added to a group in step S330). Moreover, a horizontal distance and a vertical distance between solder balls which belong to each group can be determined by measuring a horizontal distance and a vertical distance among solder balls which configure an initially selected seed with respect to each group. As described above, a chip mounter of the present invention stores the information in a storage unit 30 and determines whether a part supplied from a part supply unit is defective or not using information stored in a storage unit.

FIGS. 5A to 5K are diagrams illustrating a method for recognizing a BGA package according to an exemplary embodiment of the present invention. The method for recognizing a BGA package according to an exemplary embodiment of the present invention will be described below in detail with reference to FIGS. 5A to 5K.

Figure 5A:
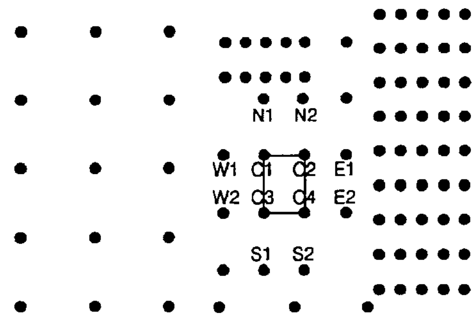
FIGS. 5A to 5K are diagrams illustrating a method for recognizing a BGA package through a chip mounter according to an exemplary embodiment of the present invention.

Referring to FIG. 5A, image information including location information of solder balls is acquired using an image acquisition unit 10 which includes, for example, a camera, and then four solder balls C1, C2, C3, and C4 are selected as a seed.

Figure 5B:
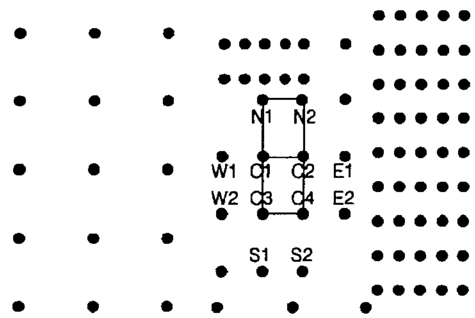

Referring to FIG. 5B, a solder ball N1 located above the seed (C1, C2, C3, and C4) is selected as a determination target solder ball, and it is determined whether a vertical distance between solder balls which configure the seed (that is, a distance between the solder balls C1 and C3) is equal to a vertical distance between the determination target solder ball N1 and the seed (that is, a distance between the determination target solder ball N1 and the solder ball C1) or not.

Since the two distances are equal as shown in FIG. 5B, the determination target solder ball N1 is grouped into the same group as the current seed (C1, C2, C3, and C4). That is, the determination target solder ball N1 is added to the current group. Then, a solder ball N2 is selected as a new determination target solder ball, and the above-described process is repeated, so that the determination target solder ball N2 is added to the current group.

Figure 5C:
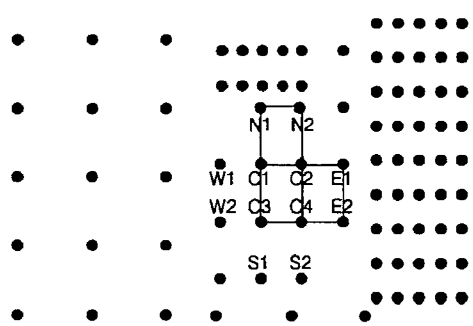

Referring to FIG. 5C, a solder ball E1 located at the right side of the current seed (C1, C2, C3, and C4) is selected as a determination target solder ball, and it is determined whether a horizontal distance between solder balls which configure the seed (that is, a distance between the solder balls C1 and C2) is equal to a horizontal distance between the determination target solder ball E1 and the seed (that is, a distance between the determination target solder ball E1 and the solder ball C2) or not. Since the two distances are equal as shown in FIG. 5C, the determination target solder ball E1 is added to the current group. Then, a solder ball E2 is selected as a new determination target solder ball, and the above-described process is repeated, so that the determination target solder ball E2 is added to the current group.

Figure 5D:
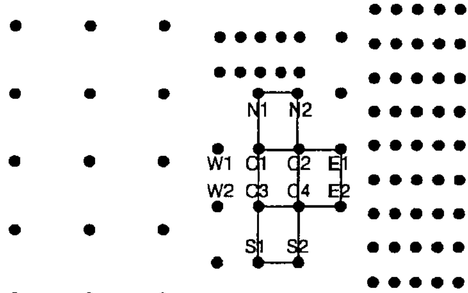

Next, referring to FIG. 5D, a solder ball S1 located below the current seed (C1, C2, C3, and C4) is selected as a determination target solder ball, and a process similar to that described in FIG. 5B is performed to add the determination target solder ball S1 to the current group, and a solder ball S2 is then added to the current group.

Figure 5E:
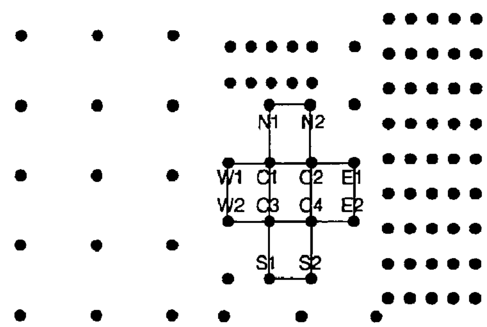

Referring to FIG. 5E, a process similar to that described in FIG. 5C is performed with respect to solder balls W1 and W2 located at the left side of the current seed (C1, C2, C3, and C4), so that the solder balls W1 and W2 are added to the current group.

Figure 5F:
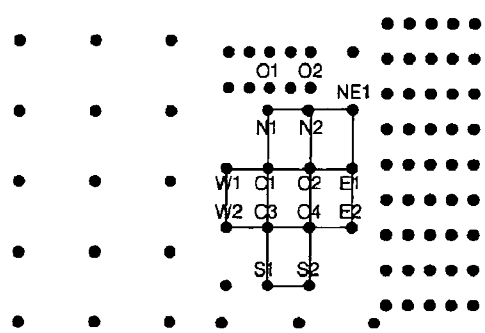

Referring to FIG. 5F, among solder balls C1, C2, C3, C4, N1, N2, E1, E2, S1, S2, W1, and W2 which belong to the current group, four solder balls N1, N2, C1, and C2 are selected as a new seed. Then, solder balls O1 and O2 located above the current seed (N1, N2, C1, and C2) are selected as determination target solder balls, respectively, and the process described in FIG. 5B is performed. The solder balls O1 and O2 are not added to the current group since a distance between the solder ball O1 and the solder ball N1 of the seed and a distance between the solder ball O2 and the solder ball N2 of the seed are different from a vertical distance of the current seed (that is, a distance between the solder ball N1 or N2 and the solder ball C1 or C2).

Then, a solder ball NE1 located at the right side of the current seed (N1, N2, C1, and C2) is selected as a determination target solder ball, and the process described in FIG. 5C is performed. The solder ball NE1 is added to the current group since a horizontal distance between the solder ball NE1 and the solder ball N2 is equal to a horizontal distance between the solder balls which configure the seed.

Figure 5G:
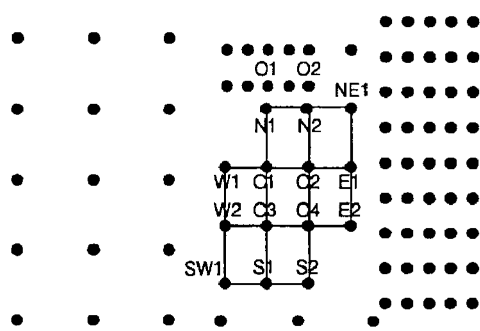

Referring to FIG. 5G, among the solder balls C1, C2, C3, C4, N1, N2, E1, E2, S1, S2, W1, and W2 which belong to the current group, four solder balls C3, C4, S1, and S2 are selected as a new seed, and a solder ball SW1 located at the left side of the seed is selected as a determination target solder ball. The process described above is performed, so that the solder ball SW1 is added to the current group.

Figure 5H:
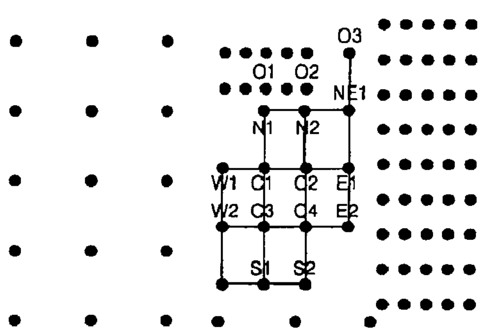

Referring to FIG. 5H, among the solder balls C1, C2, C3, C4, N1, N2, E1, E2, S1, S2, W1, and W2 which belong to the current group, four solder balls N2, NE1, C2, and E1 are selected as a seed, and a solder ball O3 located above the seed is selected as a determination target solder ball. The process described above is performed, so that the solder ball O3 is added to the current group.

Figure 5I:
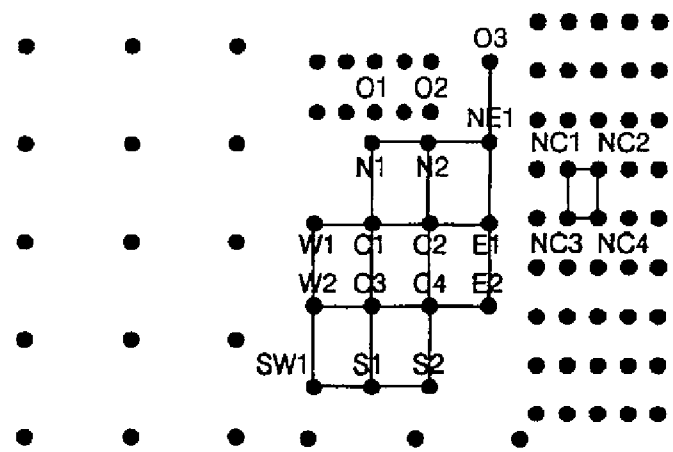

Referring to FIG. 5I, it is determined whether or not a new seed can be selected among the solder balls C1, C2, C3, C4, N1, N2, E1, E2, S1, S2, W1, W2, NE1, SW1 and O3 which belong to the current group. Since a new seed cannot be selected among solder balls which belong to the current group, four solder balls NC1, NC2, NC3, NC4 among solder balls which are not grouped are selected as a new seed.

Figure 5J:
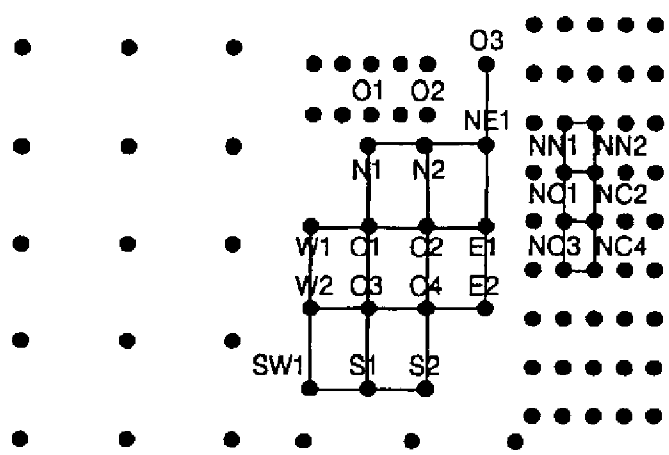

Referring to FIG. 5J, solder balls NN1 and NN2 located above the seed are selected as a determination target solder ball, respectively, and the process described in FIG. 5B is performed, so that the solder balls NN1 and NN2 are added to the same group as the seed which includes four solder balls NC1, NC2, NC3, NC4.

Figure 5K:
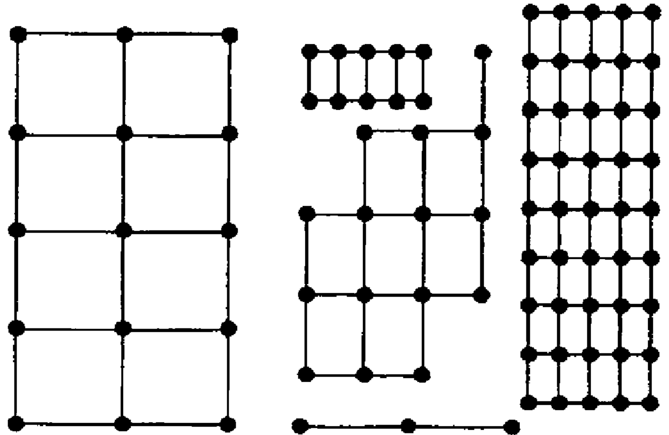

The above-described process is repeated until the number of solder balls which are not grouped is zero or there remain only solder balls which cannot be grouped. Accordingly, in case of the multi-BGA package shown in FIG. 3, solder balls are grouped into five groups as shown in FIG. 5K.

As described above, the method for recognizing a BGA package according to the present invention may be performed so that the above-described process may be simultaneously performed with respect to a plurality of seeds. For example, the processes described in FIGS. 5A and 5I may be simultaneously performed, so that two seeds C1, C2, C3, and C4 and NC1, NC2, NC3, and NC4 may be simultaneously selected, and the processes described in FIGS. 5B to 5H and the process described in FIG. 5J may be simultaneously performed, so that two seeds C1, C2, C3, and C4 and NC1, NC2, NC3, and NC4 may be simultaneously grown.

FIGS. 5A and 5I show an example in which one seed is selected within one group and is grown, but a plurality of seeds may be selected within one group and be simultaneously grown.

Figure 6:
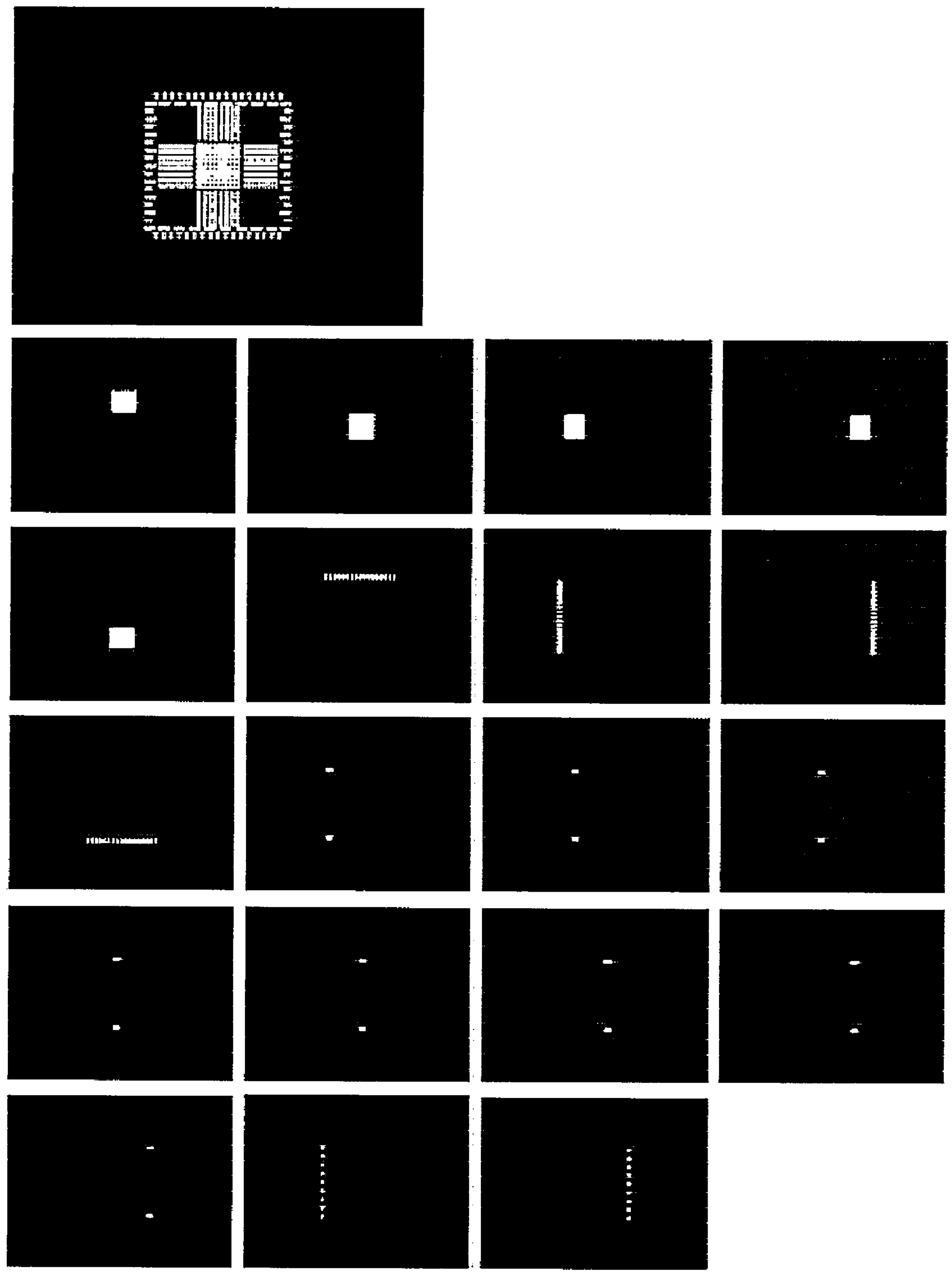
FIGS. 6 and 7 show embodiments in which a multi-BGA package is recognized by a method for recognizing a BGA package through a chip mounter according to an exemplary embodiment of the present invention.
Figure 7:
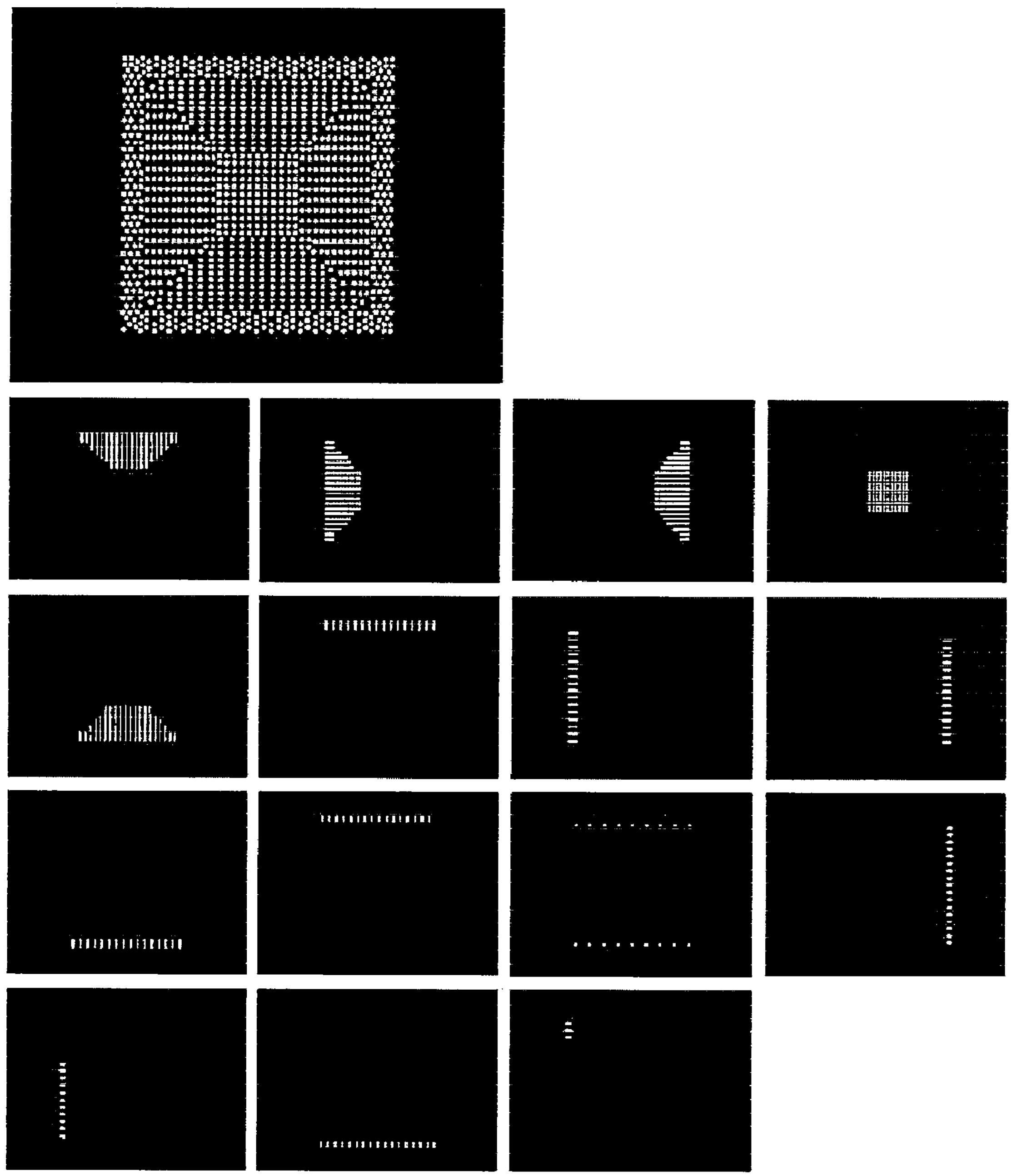

FIGS. 6 and 7 show embodiments in which information of an electronic part which includes a BGA package is extracted using the method for recognizing a BGA package according to an exemplary embodiment of the present invention.

In the BGA package shown in FIG. 6, solder balls are grouped into 19 groups, and in the BGA package shown in FIG. 7, solder balls are grouped into 15 groups. Using the method for recognizing a BGA package according to various embodiments of the present invention, it is possible to determine a horizontal pitch and a vertical pitch between solder balls which belong to each group, the number of solder balls which belong to each group and information about the size of solder balls which belong to each group as well as how many groups that solder balls of a BGA package are grouped into, with respect to FIGS. 6 and 7, respectively.

That is, in the chip mounter and the method for recognizing a BGA package according to various embodiments of the present invention, information of an electronic part which includes a BGA package, particularly one in which solder balls have a plurality of patterns, can be automatically recognized and stored, so that a time for registering information of an electronic part to a chip mounter can be saved, and an electronic part can be more accurately inspected for defects using the information.

As described above, the BGA package recognition apparatus of the chip mounter can automatically recognize and store information of an electronic apart which includes a BGA package.

The system or systems may be implemented on any form of computer or computers and the components may be implemented as dedicated applications or in client-server architectures, including a web-based architecture, and can include functional programs, codes, and code segments. Any of the computers may comprise a processor, a memory for storing program data and executing it, a permanent storage such as a disk drive, a communications port for handling communications with external devices, and user interface devices, including a display, keyboard, mouse, etc. When software modules are involved, these software modules may be stored as program instructions or computer readable codes executable on the processor on a computer-readable media such as read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. This media can be read by the computer, stored in the memory, and executed by the processor.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. Numerous modifications and adaptations will be readily apparent to those skilled in this art without departing from the spirit and scope of the present invention.

What is claimed is:

1. A chip mounter, comprising:

a Ball Grid Array (BGA) package recognition apparatus including:

an image acquisition unit which acquires image information of a BGA package which includes a plurality of solder balls having n patterns wherein n is an integer which is equal to or more than 1;

a pattern recognition unit which analyzes the image information and outputs information about the BGA package; and a storage unit which stores the information about the BGA package, wherein the pattern recognition unit recognizes the n patterns, selects n seeds respectively corresponding to the n patterns and performs a seed growing operation which groups solder balls which are continuously disposed adjacent to the seed and have the same pattern as the seed into the same group as the seed, with respect to each of the n seeds.

2. The chip mounter of claim 1, wherein the information of the BGA package includes information as to how many groups the plurality of solder balls are grouped into, the number of solder balls which belong to each group, and a vertical distance and a horizontal distance between solder balls which belong to each group.

3. The chip mounter of claim 1, wherein the pattern recognition unit sequentially performs the seed growing operation with respect to each of the n seeds.

4. The chip mounter of claim 1, wherein the pattern recognition unit simultaneously performs the seed growing operation with respect to each of the n seeds.

5. The chip mounter of claim 1, wherein the pattern recognition unit selects a plurality of seeds within a group corresponding to each of the n seeds and simultaneously performs the seed growing operation with respect to each of the plurality of seeds.

6. The chip mounter of claim 1, wherein the pattern recognition unit performs the seed growing operation until there is no solder ball which is not grouped or there remain only solder balls which are not recognized as a group among the plurality of solder balls.

7. The chip mounter of claim 1, wherein the pattern recognition unit selects, as a seed, four solder balls which are configured in a rectangular form among the plurality of solder balls or two solder balls which are horizontally or vertically configured if there are no solder balls configured in a rectangular form.

8. The chip mounter of claim 7, wherein the pattern recognition unit selects the seed in an area in which solder balls are most densely disposed.

9. The chip mounter of claim 1, wherein the pattern recognition unit performs the seed growing operation by selecting a determination target solder ball among solder balls adjacent to the seed, performing a grouping operation for adding the determination target solder ball to the same group as the seed if the determination target solder ball has the same pattern as the seed and performing the grouping operation based on a new seed if a new seed can be selected within the same group as the seed.

10. The chip mounter of claim 9, wherein the pattern recognition unit determines that the determination target solder ball is in the same pattern as the seed if a distance between the seed and the determination target solder ball is equal to a vertical distance between solder balls which configure the seed when a solder ball above or below the seed is selected as the determination target solder ball, and determines that the determination target solder ball is in the same pattern as the seed if a distance between the seed and the determination target solder ball is equal to a horizontal distance between solder balls which configure the seed when a solder ball at the left or right side of the seed is selected as the determination target solder ball.

11. The chip mounter of claim 9, wherein the pattern recognition unit additionally acquires information about the size of the plurality of solder balls, selects the seed among solder balls which are the same in size and performs the seed growing operation with respect to solder balls which configure the seed and solder balls which are the same in size.

12. The chip mounter of claim 11, wherein the pattern recognition unit selects the determination target solder ball among solder balls which are adjacent to the seed and are the same in size as solder balls which configure the seed.

13. The chip mounter of claim 11, wherein the pattern recognition unit performs the grouping operation by additionally determining whether or not the size of the determination target solder ball is identical to the size of solder balls which configure the seed.

14. The chip mounter of claim 1, further comprising, a part supply unit which supplies the BGA package;

a substrate transfer unit which transfers a printed circuit board (PCB) substrate which is externally supplied;

a head which includes the image acquisition unit and mounts a BGA package supplied from the part supply unit on the PCB substrate; and a controller which includes the pattern recognition unit and the storage unit and controls the part supply unit, the substrate transfer unit, and the head.

* * * * *